(12) United States Patent
Kato

(10) Patent No.: US 7,061,052 B2
(45) Date of Patent: Jun. 13, 2006

(54) INPUT PROTECTION CIRCUIT CONNECTED TO PROTECTION CIRCUIT POWER SOURCE POTENTIAL LINE

(75) Inventor: Katsuhiro Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 110 days.

(21) Appl. No.: 10/323,912

(22) Filed: Dec. 20, 2002

(65) Prior Publication Data

US 2003/0116806 A1 Jun. 26, 2003

Related U.S. Application Data

(62) Division of application No. 09/503,747, filed on Feb. 15, 2000, now Pat. No. 6,515,337.

(30) Foreign Application Priority Data

Feb. 18, 1999 (JP) .................................. 11-040217

(51) Int. Cl.
 *H01L 23/62* (2006.01)
(52) U.S. Cl. ....................... 257/357; 257/355; 257/356; 257/358; 257/359; 257/360; 360/56
(58) Field of Classification Search ................ 257/357, 257/355, 356, 380, 489
 See application file for complete search history.

(56) References Cited

U.S. PATENT DOCUMENTS

| | | | | |
|---|---|---|---|---|
| 4,937,700 A | * | 6/1990 | Iwahashi | 361/56 |
| 5,196,996 A | * | 3/1993 | Oh | 363/60 |
| 5,416,431 A | * | 5/1995 | Strauss | 326/95 |
| 5,479,034 A | * | 12/1995 | Hashimoto et al. | 257/213 |
| 5,514,893 A | * | 5/1996 | Miyanaga et al. | 257/360 |
| 5,561,312 A | * | 10/1996 | Nozoe et al. | 257/357 |
| 5,616,940 A | * | 4/1997 | Kato et al. | 257/206 |
| 5,739,571 A | * | 4/1998 | Kurachi | 257/360 |
| 5,760,428 A | * | 6/1998 | Colwell et al. | 257/206 |
| 5,784,235 A | * | 7/1998 | Otomo et al. | 361/56 |
| 5,917,689 A | * | 6/1999 | English et al. | 361/56 |
| 5,942,931 A | * | 8/1999 | Yanai | 327/313 |
| 6,049,111 A | * | 4/2000 | Higuchi et al. | 257/355 |

(Continued)

FOREIGN PATENT DOCUMENTS

JP 63-219153 * 9/1988

(Continued)

*Primary Examiner*—Minhloan Tran
*Assistant Examiner*—Ahmed N. Sefer
(74) *Attorney, Agent, or Firm*—Venable LLP; Michael A. Sartori; Catherine M. Voorhees

(57) ABSTRACT

An input protection circuit capable of precisely bypassing a surge current to a power source terminal and protecting the gate of a protective transistor from an electrostatic surge. The input protection circuit has an input terminal which receives an input signal, a first power source terminal which receives a first power source electric potential, and a first protective power source potential line connected to the first power source terminal for supplying the first power source electric potential to an input protection circuit. The input protection circuit has a first input protection transistor of a first conductive type having a drain connected to the input terminal, a gate and a source connected to the first protective power source potential line. Moreover, the input protection circuit has a second input protection transistor of the first conductive type having a drain connected to an input terminal of an internal circuit, a gate connected to the input terminal via a protective resistor, and a source connected to the first protective power source potential line.

21 Claims, 8 Drawing Sheets

U.S. PATENT DOCUMENTS

| | | | | |
|---|---|---|---|---|
| 6,114,731 A | * | 9/2000 | London | 257/355 |
| 6,128,173 A | * | 10/2000 | Iwasaki | 361/111 |
| 6,333,656 B1 | * | 12/2001 | Schober | 327/202 |
| 6,455,898 B1 | * | 9/2002 | Liu et al. | 257/360 |
| 6,608,744 B1 | * | 8/2003 | Kato | 361/111 |
| 6,784,496 B1 | * | 8/2004 | Brodsky et al. | 257/355 |

FOREIGN PATENT DOCUMENTS

| | | | |
|---|---|---|---|
| JP | 02-090669 | | 3/1990 |
| JP | 6-77416 | * | 3/1994 |
| JP | 06-077416 | | 3/1994 |
| JP | 6-77416 | * | 6/1994 |
| JP | 6-283678 | * | 10/1994 |
| JP | 06-326307 | | 11/1994 |
| JP | 7-58210 | * | 3/1995 |
| JP | 9-312345 | * | 1/1997 |
| JP | 10-189958 | | 7/1998 |
| JP | 10-340996 | | 12/1998 |
| TW | 218934 | * | 1/1994 |

* cited by examiner

INPUT PROTECTION CIRCUIT CONNECTED TO PROTECTION CIRCUIT POWER SOURCE POTENTIAL LINE

CROSS REFERENCE TO RELATED APPLICATIONS

This is a divisional of application Ser. No. 09/503,747, filed Feb. 15, 2000, now U.S. Pat. No. 6,515,337, which is incorporated by reference.

BACKGROUND OF THE INVENTION

The present invention relates to an input protection circuit of a semiconductor apparatus, and more particularly to an electrostatic destruction prevention protection circuit.

Currently, among semiconductor integrated circuits, CMOS-ICs (Complementary Metal Oxide Semiconductor-Integrated Circuits) are becoming a main stream since they consume low power and achieve a high degree of integration. A MOS transistor used for such a CMOS-IC is formed by the following process. First, a thin oxide film, so called a gate oxide film, is formed on a semiconductor substrate. Second, electrodes are formed on this gate oxide film. Third, a source and a drain are formed separately on the semiconductor substrate. When an electrostatic surge enters from outside (input terminal) into a MOS transistor formed by the above-described process, the gate oxide film is easily destroyed. Therefore, electrostatic destruction prevention protection circuits are formed near the input terminal and the output terminal of the semiconductor apparatus, respectively.

A protective resistor formed between the internal circuit and the input terminal, an electrostatic destruction prevention protection circuit having a protective transistor formed between the internal circuit and the power source potential line that supplies power source electric potential, and an electrostatic destruction prevention protection circuit having a protective transistor formed between the internal circuit and a ground potential line that supplies the ground electric potential are exemplary electrostatic destruction prevention protection circuits. The protection circuit delays the surge current while the surge current is transmitted to the power source potential line or ground potential line for the internal circuit so that an excessive voltage will not be applied to, for example, the gate electrode of an input transistor that constitutes an inverter closest to the input terminal of the internal circuit. Moreover, the protective transistor bypasses the surge current from the input terminal to the power source or the ground.

In recent years as semiconductors are scaled down, the gate oxide film of an input transistor is getting thinner. As a result, the gate oxide film is also becoming less breaking resistant. Hence, the resistance of the above-described protective resistor needs to be increased. Moreover, as the chip size is increased, the wire length of the power source potential line from the power source terminal to the protective transistor and the wire length of the ground potential line from the ground terminal to the protective transistor are also increased. As a result, the parasitic resistance of each of these lines is increased. This parasitic resistance delays the surge current, which has passed through the protective transistor, from flowing into the internal circuit power source line and the ground line. As a result, the gate oxide film of the inverter becomes less breaking resistant.

SUMMARY OF THE INVENTION

Given these problems, it is an object of the present invention to provide an input protection circuit capable of precisely bypassing a surge current to the power source terminal and preventing the gate of a protective transistor from being destroyed, even when the chip size is increased and the wire resistance of the power source line is increased.

To achieve above-stated objective, an input protection circuit has an input terminal which receives an input signal, a first power source terminal which receives a first power source electric potential, a first protective power source potential line, which is connected to the first power source terminal, for supplying the first power source electric potential to an input protection transistor, a first input protection transistor of a first conductive type having a drain, a gate, and a source, the drain being connected to the input terminal, the gate and the source being connected to the first protective power source potential line, and a second input protection transistor of a first conductive type having a drain, a gate, and a source, the gate being connected to the input terminal via a protective resistor, the drain being connected to an input terminal of an internal circuit, and the source being connected to the first protective power source potential line.

DETAILED DESCRIPTION OF THE INVENTION

Figure 1:
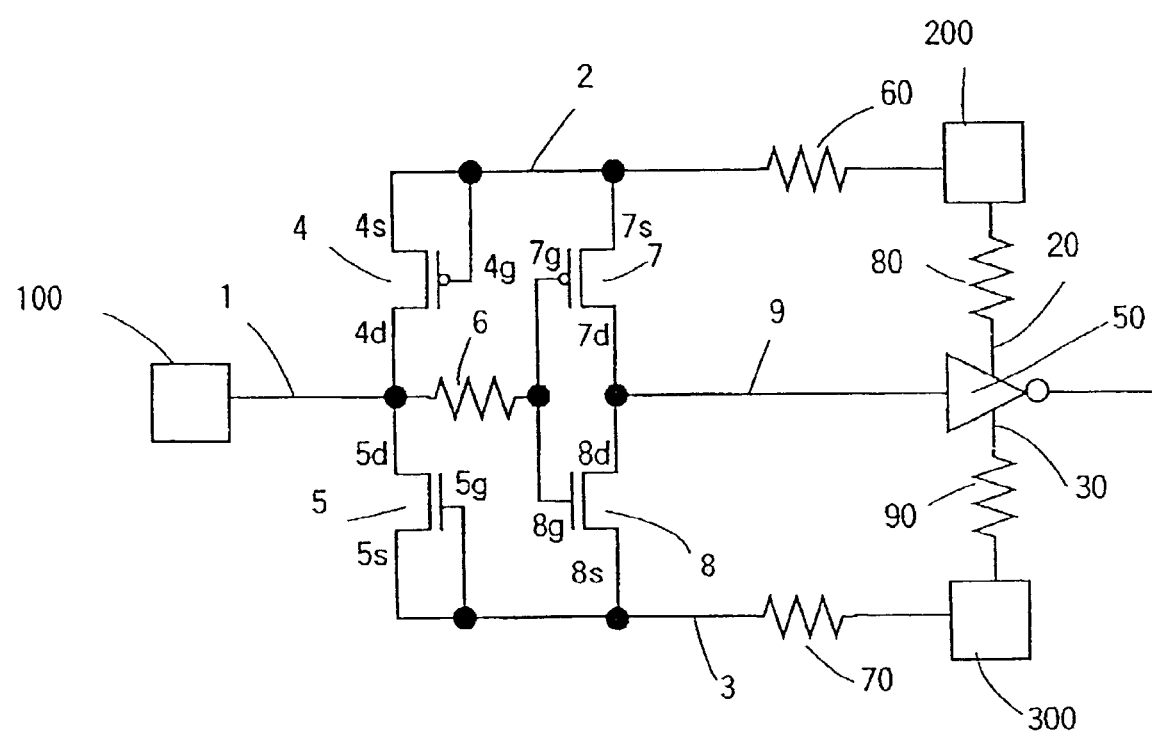
FIG. 1 is a circuit diagram showing an input protection circuit according to the first embodiment of the present invention.

FIG. 1 is a circuit diagram showing an input protection circuit according to the first embodiment of the present invention. The bonding pad 100 for connecting to an external device is an input terminal that receives an input signal from outside. The input line 1 connected to the input terminal 100 is connected to the drain 4*d* of the first PMOS protective transistor 4 and the drain 5*d* of the first NMOS protective transistor 5. The source 4*s* and gate 4*g* of the first PMOS protective transistor 4 are connected to the protective power source potential line 2. This protective power source potential line 2 is a conductive pattern that supplies the power source electric potential exclusively to the first PMOS protective transistor 4, and is formed separately from the internal circuit power source line 20 for driving the internal circuit. The source 5*s* and gate 5*g* of the first NMOS protective transistor 5 are connected to the protective ground potential line 3. This protective ground potential line 3 also provides the ground electric potential exclusively to the first NMOS protective transistor 5, and is formed separately from the internal circuit ground potential line 30 for driving the internal circuit.

The input line 1 is connected to the gate electrode 7*g* of the second PMOS protective transistor 7 and the gate electrode 8*g* of the second NMOS protective transistor 8. The second PMOS protective transistor 7 and the second NMOS protective transistor 8 constitute an inverter that is driven by an input signal supplied via the protective resistor 6. The source 7*s* of the second PMOS protective transistor 7 is connected to the protective power source potential line 2. The source 8*s* of the second NMOS protective transistor 8 is connected to the protective ground potential line 3. The drain 7*d* of the second PMOS protective transistor 7 and the drain 8*d* of the second NMOS protective transistor 8 are connected to the signal line 9. This signal line 9 is connected to the internal circuit power source potential line 20 and the input terminal of the CMOS internal inverter 50 to which an electric potential is supplied from the internal circuit ground potential line 30 (the gate of the transistor that constitutes the CMOS internal inverter 50). The protective power source potential line 2 and the internal circuit power source potential line 20 are connected to the power source potential bonding pad (power source terminal) 200. The protective ground potential line 3 and the internal circuit ground potential line 30 are connected to the ground potential bonding pad (ground terminal) 300. The protective power source potential line 2 has parasitic resistance 60. The protective ground potential line 3 has parasitic resistance 70. Similarly, the internal circuit power source potential line 20 has parasitic resistance 80, and the internal circuit ground potential line 30 has parasitic resistance 90. The protective power source potential line 2 is distinguished from the internal circuit power source potential line 20 by the parasitic resistance 60. The protective ground potential line 3 is distinguished from the internal circuit ground potential line 30 by the parasitic resistance 70.

Next, the operation of the input protection circuit of the first embodiment will be explained using as an example the case in which an electrostatic surge flows into the input protection circuit of the first embodiment between the input terminal 100 and the ground terminal 300. The electrostatic surge that has entered into the input terminal 100 passes through the input line 1, the first NMOS protective transistor 5, and the protective ground potential line 3, and is absorbed into the ground terminal 300. In this case, the surge voltage that has passed through the first NMOS protective transistor 5 directly reaches the source 8*s* of the second NMOS protective transistor 8 without passing through the protective ground potential line 3 having parasitic resistance 70.

In the first embodiment, the source 5*s* of the first NMOS protective transistor 5 and the source 8*s* of the second NMOS protective transistor 8 are connected to the protective ground potential line 3. Therefore, when the surge voltage is applied to the gate 8*g* and source 8*s* of the second NMOS protective transistor 8, the gate 8*g* and source 8*s* are quickly set to the same electric potential. Therefore, the gate oxide film between the gate 8*g* and the source 8*s* of the second NMOS protective transistor 8 can be effectively prevented from being destroyed. Moreover, since the source 4*s* of the first PMOS protective transistor 4 is connected to the source 7*s* of the second PMOS protective transistor 7, the gate oxide film between the gate 7*g* and the source 7*s* of the second PMOS protective transistor 7 can be effectively prevented from being destroyed.

Figure 2:
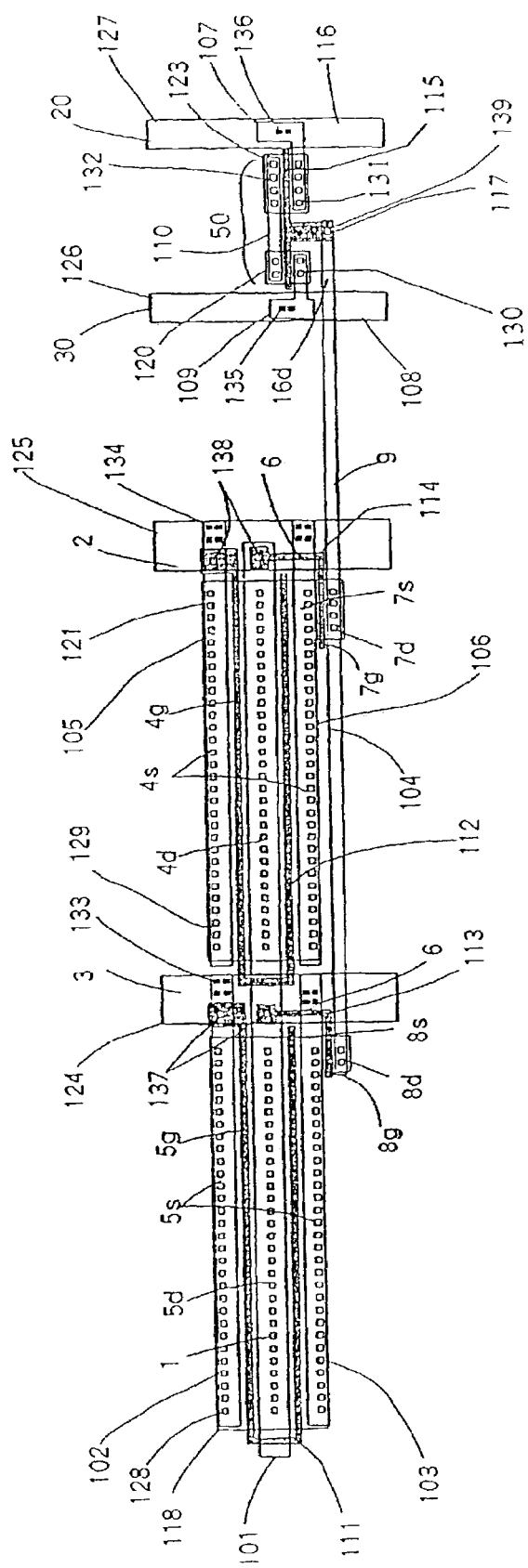
FIG. 2 shows the layout of an input protection circuit according to the second embodiment of the present invention.

FIG. 2 shows the layout of the input protection circuit according to the second embodiment of the present invention. This input protection circuit according to the second embodiment has the same circuit configuration as the input protection circuit according to the first embodiment. Therefore, in FIG. 2, the same reference numerals are given to the portions in which the sources, drains, gates, and the like shown in FIG. 1 are laid out. Such portions will not be explained again here.

The input protection circuit according to the second embodiment has N-type impurity diffusion layers 118 and 120, P-type impurity diffusion layers 121 and 123, poly-silicide layers 111 through 117 that are used primarily as gate electrodes, first metal layers 101 through 110 that are used as lower layer wiring layers, and second metal layers 124 through 127 that are used as upper layer wiring layers. Connection holes 128 through 132 are formed between the first metal layers 101 through 110 and the N-type impurity diffusion layers 118 through 120 and P-type impurity diffusion layers 121 through 123. Connection holes 133 through 136 are formed between the second metal layers 124 through 127 and the first metal layers 101 through 110. Connection holes 137 through 140 are formed between the first metal layers 101 through 110 and the poly-silicide layers 111 through 117. The conductive layers 101 through 117 and 124 through 127 are electrically connected to each other via these connection holes 128 through 140. The conductive layers 101 through 117 and 124 through 127 are separated from each other by insulating layers not shown in the drawing.

As the layout of FIG. 2 shows, the source 5*s* of the first NMOS protective transistor 5 and the source 8*s* of the second NMOS protective transistor 8 are made of the same N-type impurity active region 118. The source 4*s* of the first PMOS protective transistor 4 and the source 7*s* of the second PMOS protective transistor 7 are made of the same P-type impurity active region 121.

The gate 5*g* of the first NMOS protective transistor 5 is made of a poly-silicide pattern 111 that is folded back at one end. This poly-silicide pattern 111 is connected to the first metal layer 102 via the connection hole 137. The poly-silicide pattern 113 that forms the gate 8*g* of the second NMOS protective transistor 8 is connected to the first metal layer 101 via the connection hole 137. The wire portion of the poly-silicide pattern 113 between the portion that constitutes the gate 8*g* of the second NMOS protective transistor 8 and the connection hole 137 functions as a protective resistor 6. In this embodiment, the protective resistor 6 is formed with a portion of the poly-silicide pattern 113. However, the protective resistor 6 can be formed with another means such as a diffusion resistor. The drain 5*d* of the first NMOS protective transistor 5 is connected to the first metal layer 101 via connection holes. This first metal layer 101 is connected to the input terminal 100 not shown in FIG. 2. A portion (the upper portion in the drawing) of the source 5*s* of the first NMOS protective transistor 5 is connected to the first metal layer 102 via the connection hole 128. This first metal layer 102 is connected to the second metal layer 124 that constitutes the protective ground potential line 3 via the connection hole 133. The N-type impurity diffusion layer shared by the other portion (lower portion in the drawing) of the source 5s of the first NMOS protective transistor 5 and the source 8s of the second NMOS protective transistor 8 is connected to the first metal layer 103 via connection holes. This first metal layer 103 is connected to the second metal layer 124 that constitutes the protective ground potential line 3.

The gate 4g of the first PMOS protective transistor 4 is made of a poly-silicide pattern 112 that is folded back at one end. This poly-silicide pattern 112 is connected to the first metal layer 105 via connection hole 138. The poly-silicide pattern 114 that constitutes the gate 7g of the second PMOS transistor 7 is connected to first metal layer 101 via connection hole 138. The wire portion of the poly-silicide pattern 114 between the portion that constitutes the gate 7g of the second PMOS protective transistor 7 and the connection hole 138 also functions as a protective resistor 6 like the poly-silicide pattern 113. The drain 4d of the first PMOS protective transistor 4 is connected to the first metal layer 101 via connection holes. A portion (the upper portion in the drawing) of the source 4s of the first PMOS protective transistor 4 is connected to the first metal layer 105 via the connection hole 129. This first metal layer 105 is connected to the second metal layer 125 that constitutes the protective power source potential line 2 via the connection hole 134. The N-type impurity diffusion layer shared by the other portion (lower portion in the drawing) of the source 4s of the first PMOS protective transistor 4 and the source 8s of the second NMOS protective transistor 8 is connected to the first metal layer 106 via connection holes. This first metal layer 106 is connected to the second metal layer 125 that constitutes the protective power source potential line 2.

The drain 8d of the second NMOS protective transistor 8 and the drain 7d of the second PMOS protective transistor 7 are connected to the first metal layer 104 that constitutes the signal line 9 via connection holes. This first metal layer 104 is connected to the poly-silicide pattern that constitutes the input line of the internal inverter 50, the gates of the PMOS transistor and NMOS transistor that constitute the internal inverter 50 via the connection hole 139. The drains of the PMOS transistor and NMOS transistor that constitute the internal inverter 50 are connected to the first metal layer 110 via connection holes. Though not shown in the drawing, this first metal layer 110 is connected to another internal circuit. The source of the NMOS transistor that constitutes the internal inverter 50 is connected to the first metal layer 109 via connection holes. This first metal layer 109 is connected to the second metal layer 126 that constitutes the internal circuit ground potential line 30. The source of the PMOS transistor that constitutes the internal inverter 50 is connected to the first metal layer 107 via connection holes. This first metal layer 107 is connected to the second metal layer 126 that constitutes the internal circuit power source potential line 20 via the connection hole 136.

As is evident from FIG. 2, the dimensions of the second NMOS protective transistor 8 are much smaller than those of the first NMOS protective transistor 5. Also, the dimensions of the second PMOS protective transistor 7 are much smaller than those of the first PMOS protective transistor 4. The first protective transistors 4 and 5 are made much larger than the second protective transistors 7 and 8 because the first protective transistors 4 and 5 are directly exposed to a surge current or the like.

Thus, according to the input protective circuit of the second embodiment, the source 5s of the first NMOS protective transistor 5 and the source 8s of the second NMOS protective transistor 8 are made of the same N-type impurity active region 118. Therefore, the drain 5d of the first NMOS protective transistor 5 and the drain 8d of the second NMOS protective transistor 8 have the same electric potential. Moreover, the source 4s of the first PMOS protective transistor 4 and source 7s of the second PMOS protective transistor 7 are made of the same P-type impurity active region 121. Therefore, the drain 4d of the first PMOS protective transistor 4 and the drain 7d of the second PMOS protective transistor 7 have the same electric potential.

Based on these assumptions, the operation of the input protection circuit of the second embodiment will be explained using as an example the case in which an electrostatic surge has entered between the input terminal 100 and the power source terminal 200. In order to protect the gate oxide film on the source 8s side of the second NMOS protective transistor 8 from the electrostatic surge that enters into the input terminal 100, the voltage that has been transmitted to the source 5s of the first NMOS protective transistor 5 via the first NMOS protective transistor 5 must be transmitted to the source 8s of the second NMOS protective transistor 8 as quickly as possible. In the input protection circuit of the second embodiment, the source 5s of the first NMOS protective transistor 5 and the source 8s of the second NMOS protective transistor 8 are formed together in the same impurity active region. The surge voltage is transmitted faster in comparison with the case in which these sources 5s and 8s are formed separately and connected with a metal wire. As a result, the gate oxide film can be protected more effectively. For the same reason, the same advantage is achieved by the first and second PMOS protective transistors 4 and 7, respectively. Moreover in the input protection circuit of the second embodiment, the sources of multiple transistors are formed together. Therefore, the pattern area occupied by the circuit can be reduced, which is another advantage.

Figure 3:
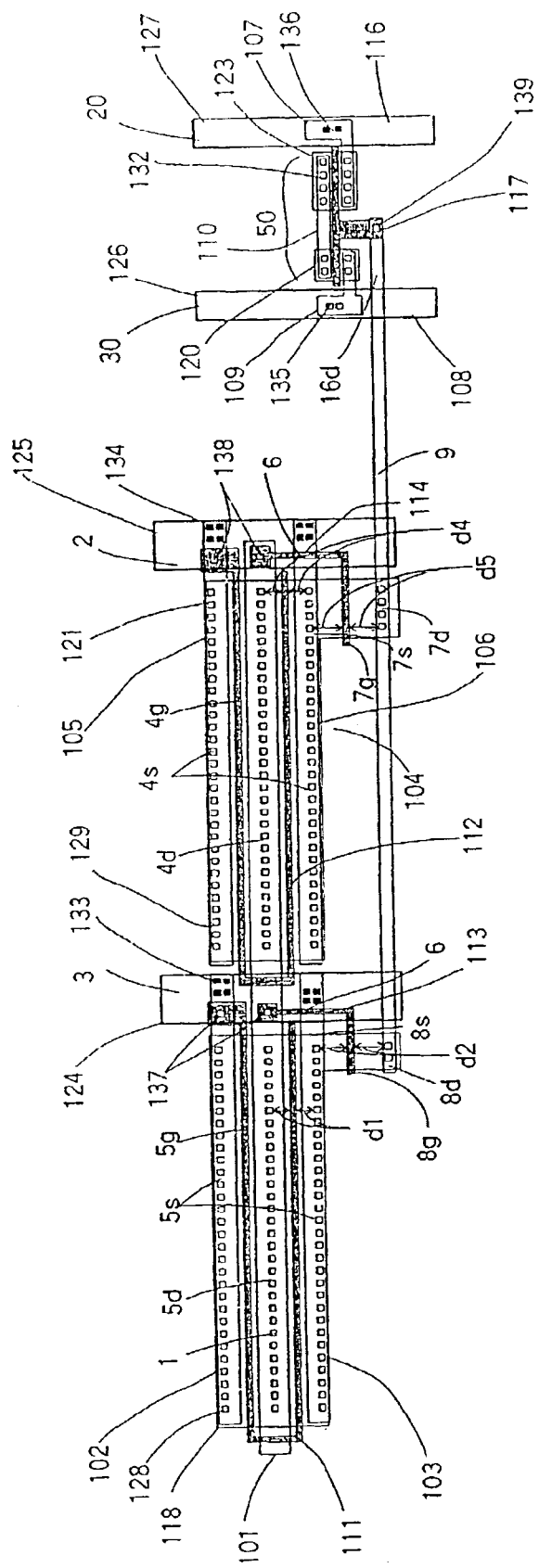
FIG. 3 shows the layout of an input protection circuit according to the third embodiment of the present invention.

FIG. 3 shows the layout of an input protection circuit according to the third embodiment of the present invention. FIG. 3 is mostly identical to FIG. 2. Hence, the same reference numerals are given to the same components that are already used in FIG. 2. Such components will not be explained again here. The input protection circuit of the third embodiment differs (or is improved) from that of the second embodiment in that the distances between the connection holes and the gate electrodes are specified. Specifically, the distance d1 from the connection holes that connect the source 5s and drain 5d of the first NMOS protective transistor 5 and the first metal layer, respectively, to the gate electrode 5g of the first NMOS protective transistor 5, and the distance d2 from the connection holes that connect the source 8s and drain 8d of the second NMOS protective transistor 8 and the first metal layer, respectively, to the gate electrode 8g of the second NMOS protective transistor 8 are specified to satisfy the relation $d1 \leq d2$.

Moreover, a similar relation is prescribed for the PMOS protective transistor side. Specifically, the distance d4 from the connection holes that connect the source 4s and drain 4d of the first PMOS protective transistor 4 and the first metal layer, respectively, to the gate electrode 4g of the first PMOS protective transistor 4, and the distance d5 from the connection holes that connect the source 7s and drain 7d of the second PMOS protective transistor 7 and the first metal layer, respectively, to the gate electrode 7g of the second NMOS protective transistor 7 are specified to satisfy the relation d4≦d5.

The operation of the input protection circuit of the third embodiment will be explained using as an example the case in which an electrostatic surge has entered between the ground terminal 300 and the power source terminal 200. When an electrostatic surge flows into the power source terminal 200, the electrostatic surge can reach the ground terminal 300 through the following two paths. The first path passes through the source 4s and drain 4d of the first PMOS protective transistor 4 (that is, the input line 1), the drain 5d and source 5s of the first NMOS protective transistor 5, in this order, and reaches the ground terminal 300. The second path passes through the source 7s and drain 7d of the second PMOS protective transistor 7, the drain 8d and source E: of the second NMOS protective transistor 8, in this order, and reaches the ground terminal 300.

As has been explained in the second embodiment, the dimensions (areas) of the second NMOS protective transistor 8 and second PMOS protective transistor 7 are smaller than those of the first NMOS protective transistor 5 and first PMOS protective transistor 4. Therefore, the distances from the gate electrodes of the second NMOS protective transistor 8 and second PMOS protective transistor 7 to the connection holes of the source, drain, and first metal layer of the second NMOS protective transistor 8 and second PMOS protective transistor 7, respectively, can be made smaller than corresponding dimensions of the first NMOS protective transistor 5 and first PMOS protective transistor 4. When the distances from the gate electrodes to the connection holes are decreased, the parasitic resistance of the source and the parasitic resistance of the drain are also decreased. When the distance from the gate electrodes of the second PMOS protective transistor 7 and second NMOS protective transistor 8 to the connection holes of the source, drain, and the first metal layer is decreased, the proportion of the surge current that flows through the second path from the power source terminal 200 to the ground terminal 300 increases.

In the input protection circuit of the third embodiment, the distance d1 from the connection holes that connect the source 5s and drain 5d of the first NMOS protective transistor 5 and the first metal layer, respectively, to the gate electrode 5g of the first NMOS protective transistor 5, and the distance d2 from the connection holes that connect the source 8s and drain 8d of the second NMOS protective transistor 8 and the first metal layer, respectively, to the gate electrode 8g of the second NMOS protective transistor 8 are specified to satisfy the relation d1≦d2. Also, the distance d4 from the connection holes that connect the source 4s and drain 4d of the first PMOS protective transistor 4 and the first metal layer, respectively, to the gate electrode 4g of the first PMOS protective transistor 4 and the distance d5 from the connection holes that connect the source 7s and drain 7d of the second PMOS protective transistor 7 and the first metal layer, respectively, to the gate electrode 7g of the second NMOS protective transistor 7 are specified to satisfy the relation d4<d5. Therefore, since the transistor area of the second path is smaller than that of the first path, the proportion of the surge current that passes through the second path is smaller than the proportion of the surge current that passes through the first path.

The distances d1, d2, d4, and d5 between the first metal layer and the above-described connection holes satisfy the relations d1≦d2 and d4≦d5 in this embodiment. However, as is clear from the explanation above, it is desirable that these relations be strict inequalities d1≦d2 and d4≦d5.

Thus, the input protection circuit of the third embodiment is designed, to cause the surge current to flow through the path that contains the first PMOS protective transistor 4 and the first NMOS protective transistor 5 which require large areas. Therefore, the increase in the circuit area is suppressed, and a high degree of electrostatic breaking resistance can be achieved against an electrostatic surge that flows between the power source terminal 200 and the ground terminal 300.

Figure 4:
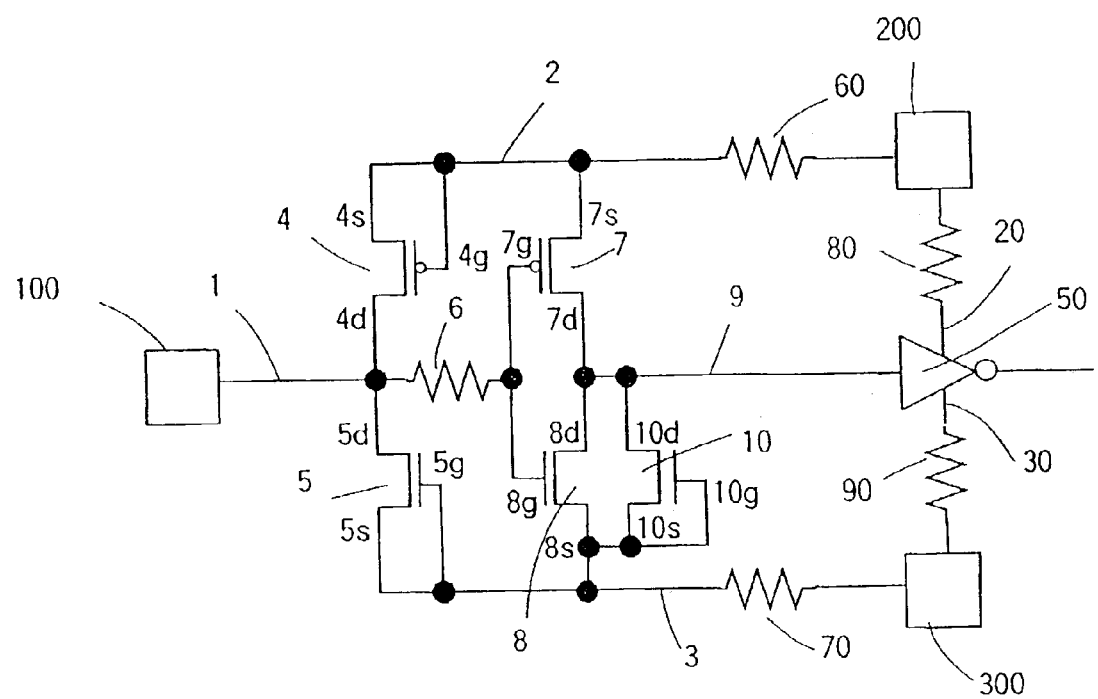
FIG. 4 is a circuit diagram showing an input protection circuit according to the fourth embodiment of the present invention.

FIG. 4 is a circuit diagram showing an input protection circuit according to the fourth embodiment of the present invention. In FIG. 4, the same reference numerals are given to the same components that are already used in FIG. 1. Such components will not be explained again here. In the input protection circuit according to the fourth embodiment, a third NMOS protective transistor 10 is added to the input protection circuit of the first embodiment.

Specifically, the drain 10d of the third NMOS protective transistor 10 is connected to the signal line 9. The source 10s and gate 10g of the third NMOS protective transistor 10 are connected to the protective ground potential line 3.

Next, the operation of the input protection circuit of the fourth embodiment will be explained using as an example the case in which an electrostatic surge has entered between the ground terminal 300 and the input terminal 100. When the electrostatic surge flows into the input terminal 100, the electrostatic surge passes through the first NMOS protective transistor 5 and the ground potential line 3, in this order, and is absorbed into the ground terminal 300. In this case, the surge voltage that has passed through the first NMOS protective transistor 5 is transmitted directly to the source 8s of the second NMOS protective transistor 8. The surge voltage also passes through the third NMOS protective transistor 10 and is transmitted to the drain 8d of the second NMOS protective transistor 8.

In the fourth embodiment, the third NMOS protective transistor 10 is added to the input protection circuit of the first embodiment. Therefore, the gate oxide film formed between the drain 8d and gate 8g of the second NMOS protective transistor 8, which could not be protected from destruction in the first embodiment, can be effectively protected from the surge current. Moreover, the drain 7d of the second PMOS protective transistor 7 is connected to the drain 8d of the second NMOS protective transistor 8, and the gate 7g of the second PMOS protective transistor 7 is connected to the gate 8g of the second NMOS protective transistor 8. Therefore, the gate oxide film formed between the drain 7d and gate 7g of the second PMOS protective transistor 7, which could not be protected in the first embodiment, can be effectively protected. The third NMOS protective transistor 10 is turned off during the normal operation mode, since the ground electric potential is supplied to the gate 10g of the third protective NMOS transistor 10. Therefore, the third protective NMOS transistor 10 does not affect the normal circuit operation. According to the fourth embodiment, no high voltage is applied to the oxide film of the input gate. Hence, the resistance value of the protective resistor 6 can be made smaller than that of the prior art. As a result, the delay of the gate signal during the normal operation can be reduced.

Figure 5:
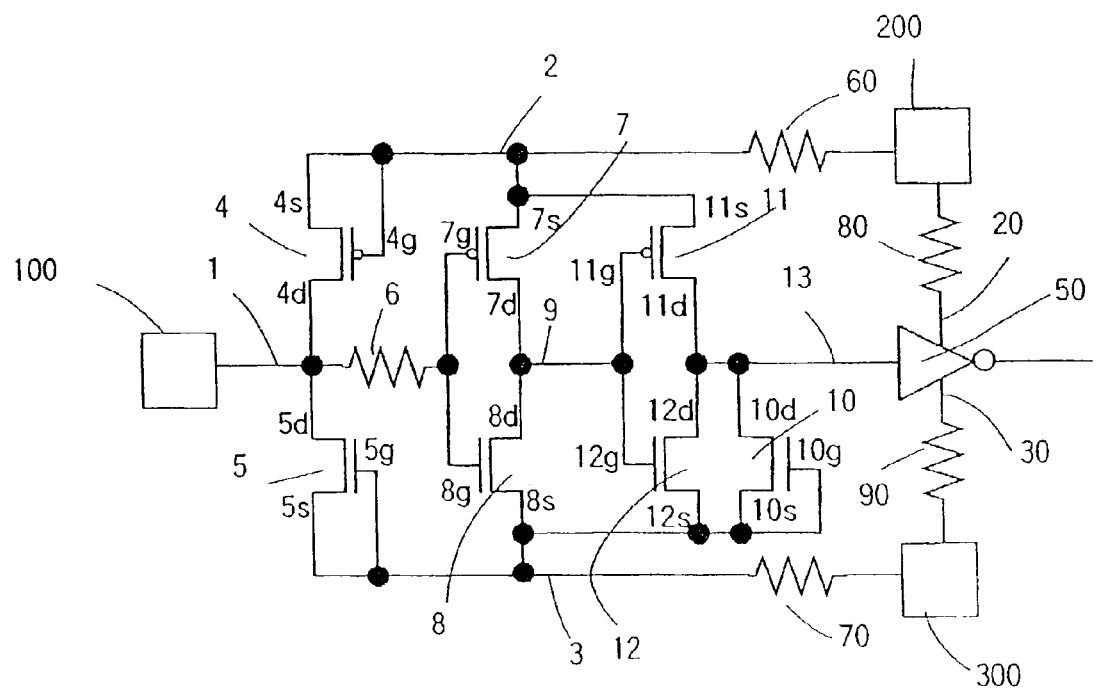
FIG. 5 is a circuit diagram showing an input protection circuit according to the fifth embodiment of the present invention.

FIG. 5 is a circuit diagram showing an input protection circuit according to the fifth embodiment of the present invention. In FIG. 5, the same reference numerals are given to the same components that are already used in FIG. 4. Such components will not be explained again here. In the input protection circuit according to the fifth embodiment, fourth PMOS protective transistor 11 and fourth NMOS protective transistor 12 are added to the input protection circuit of the fourth embodiment.

Specifically, the gate 11g of the fourth PMOS protective transistor 11 and the gate 12g of the fourth NMOS protective transistor 12 are connected to the first signal line 9. The source 11s of the fourth PMOS protective transistor 11 is connected to the protective power source potential line 2. The source 12s of the fourth NMOS protective transistor 12 is connected to the protective ground potential line 3. The drain 11d of the fourth PMOS protective transistor 11 and the drain 12d of the fourth NMOS protective transistor 12 are connected to the second signal line 13. The input terminal of the CMOS internal inverter 50 is connected to the second signal line 13. Moreover, the drain 10d of the third NMOS protective transistor 10 is connected to the second signal line 13. The source 10s and gate 10g of the third NMOS protective transistor 10 are connected to the protective ground potential line 3 as in the fourth embodiment.

Next, the operation of the input protection circuit of the fifth embodiment will be explained using as an example the case in which an electrostatic surge has entered between the ground terminal 300 and the input terminal 100. When the electrostatic surge flows into the input terminal 100, the electrostatic surge passes through the first NMOS protective transistor 5 and the ground potential line 3, in this order, and is absorbed into the ground terminal 300. In this case, the surge voltage that has passed through the first NMOS protective transistor 5 passes through the third NMOS protective transistor 10 and is transmitted to the drain of the fourth NMOS protective transistor 12.

In the input protection circuit of the fifth embodiment, two protective inverter circuits (composed of protective transistors 7, 8, 11, and 12) are formed serially between the input line 1 and the internal inverter 50. These protective inverter circuits are connected to the protective power source potential line 2 and the protective ground potential line 3 as well. Moreover, the third NMOS protective transistor 10 is connected between the protective ground potential line 3 and the second signal line 13. The third NMOS protective transistor 10 transmits the surge voltage to the drain 12d of the fourth NMOS protective transistor 12. Two capacitors made of the gate oxide films of the two transistors 8 and 12, respectively, are connected between the drain 12d of the fourth NMOS protective transistor 12 and the gate 8g of the second NMOS protective transistor 8. Therefore, a proportion of the voltage applied to the oxide film of the drain 8d of the second NMOS protective transistor 8 is supplied to the oxide film of the drain 12d of the fourth NMOS protective transistor 12. Therefore, the gate oxide film between the drain 8d and gate 8g of the second NMOS protective transistor 8 can be protected from the surge current more effectively than the input protection circuit of the first embodiment. Moreover, the gate oxide film between the drain 7d and gate 7g of the second PMOS protective transistor 7 and the gate oxide film between the drain 11d and gate 11g of the fourth PMOS protective transistor 1 can be protected from the surge current more effectively than the input protection circuit of the first embodiment in the same manner as the gate oxide film between the drain 8d and gate 8g of the second NMOS protective transistor 8 and the oxide film of the drain 12d of the fourth NMOS protective transistor 12. Moreover, two protection inverter circuits are formed serially in the input protection circuit of the fifth embodiment. Therefore, the level of the signal input to the input terminal 100 coincides with the level of the signal on the second signal line 13. Hence, the logic of the signal needs not be inverted within the internal circuit.

Figure 6:
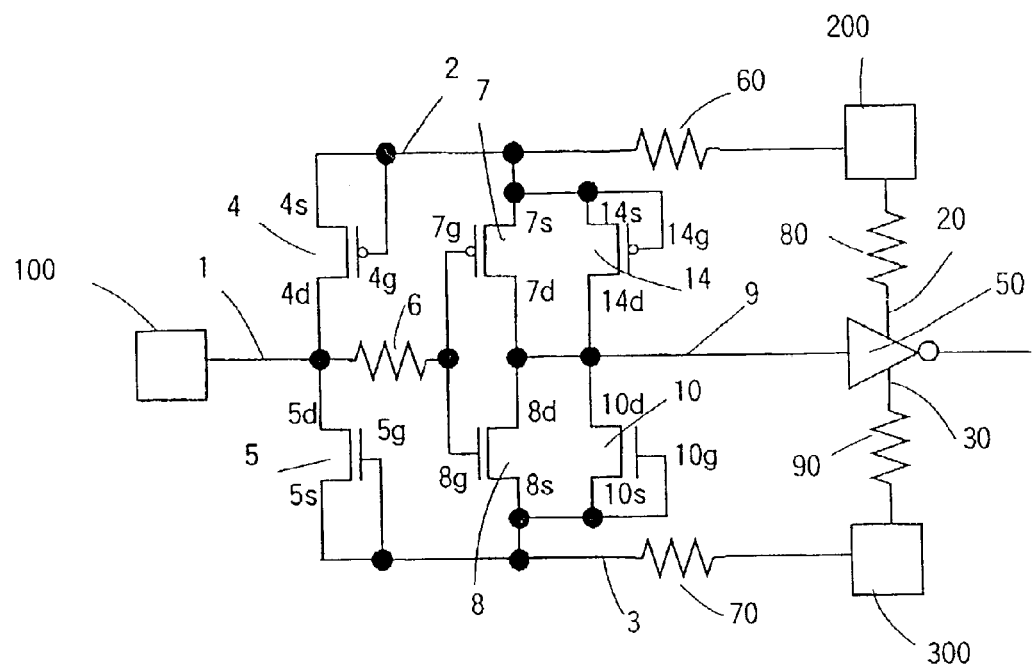
FIG. 6 is a circuit diagram showing an input protection circuit according to the sixth embodiment of the present invention.

FIG. 6 is a circuit diagram showing an input protection circuit according to the sixth embodiment of the present invention. In FIG. 6, the same reference numerals are given to the same components that are already used in FIG. 4. Such components will not be explained again here. In the input protection circuit according to the sixth embodiment, third PMOS protective transistor 14 is added to the input protection circuit of the fourth embodiment. The drain 14d of the third PMOS protective transistor 14 is connected to the signal line 9. The gate 14g of the third PMOS protective transistor 14 is connected to the protective power source potential line 2.

Next, the operation of the input protection circuit of the sixth embodiment will be explained using as an example the case in which an electrostatic surge has entered between the power source terminal 200 and the input terminal 100. When the electrostatic surge flows into the input terminal 100, the electrostatic surge passes through the input line 1, the first PMOS protective transistor 4, and protective power source potential line 2, in this order, and is absorbed into the power source terminal 200. In this case, the surge voltage that has passed through the first PMOS protective transistor 4 passes through the third PMOS protective transistor 14 and is transmitted quickly to the drain 7d of the second PMOS protective transistor 7.

In the input protection circuit of the sixth embodiment, the third PMOS protective transistor 14 is formed between the input line 1 and the internal inverter 50. These protective inverter circuits are connected to the protective power source potential line 2 and the second signal line 9. Therefore, the surge voltage passes through the first PMOS protective transistor 4 and the third PMOS protective transistor 14, and is transmitted quickly to the drain 7d of the second PMOS protective transistor 7. Hence, the gate oxide film between the drain 7d and gate 7g of the second PMOS protective transistor 7 can be protected from the surge current. The third PMOS protective transistor 14 is turned off during the normal operation mode since the power source electric potential is supplied to its gate 14g. Therefore, the third PMOS protective transistor 14 does not affect the normal circuit operation.

According to the input protection circuit of the sixth embodiment, the oxide film of the gate 7g of the second PMOS protective transistor 7 and the oxide film of the gate 8g of the second NMOS protective transistor 8 can be further protected from the electrostatic surge that flows between the input terminal 100 and the power source terminal 200 or between the input terminal 100 and the ground terminal 300. Particularly, the input protection circuit of the sixth embodiment is effectively usable as a protection circuit for a device constructed by the SOI (Silicon on Insulator) process by which no parasitic diode is formed at all between the power source terminal 300 and the ground terminal 200.

Figure 7:
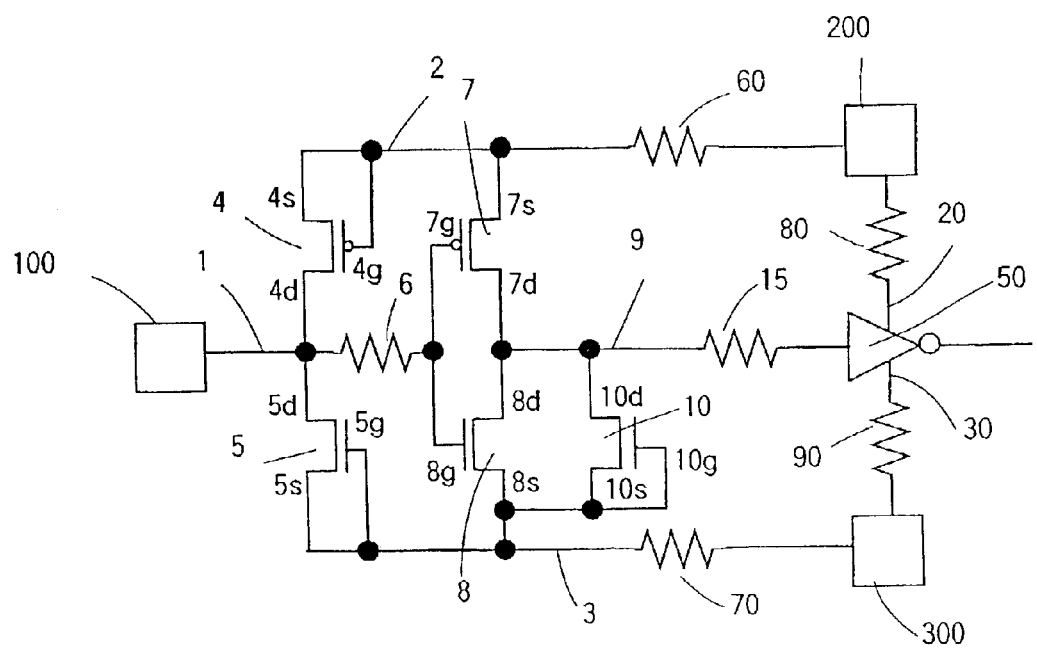
FIG. 7 is a circuit diagram showing an input protection circuit according to the seventh embodiment of the present invention.

FIG. 7 is a circuit diagram showing an input protection circuit according to the seventh embodiment of the present invention. In FIG. 7, the same reference numerals are given to the same components that are already used in FIG. 4. Such components will not be explained again here. The input protection circuit according to the seventh embodiment is obtained from the input protection circuit according to the fourth embodiment by forming a second resistor 15 between the signal line 9 and the input terminal of the CMOS internal inverter 50.

Next, the operation of the input protection circuit of the seventh embodiment will be explained using as an example the case in which an electrostatic surge has entered between the ground terminal 300 and the input terminal 100. When the electrostatic surge flows into the input terminal 100, the electrostatic surge passes through the input line 1, the first NMOS protective transistor 5, and the protective ground potential line 3, in this order, and is absorbed into the ground terminal 300. In this case, the surge voltage that has passed through the third NMOS protective transistor 10 and flowed into the signal line 9 is delayed from reaching the internal inverter 50 by the second resistor 15.

The third NMOS protective transistor 10 transmits the surge voltage that has been applied to the ground potential line 3 to the signal line 9. As a result, the voltage applied to the gate oxide film on the drain 8d side of the second NMOS protective transistor 8 is reduced. Therefore, it is desirable that the third NMOS protective transistor 10 should respond as quickly as possible. On the other hand, by having the signal line 9 transmit the surge voltage, the surge voltage is transmitted to the gate oxide film of the transistor that constitutes the internal inverter 50 also. This may cause a concern that the gate oxide film of the transistor that constitutes the internal inverter 50 may be destroyed. However, the second resistor 15 is formed between the signal line 9 and the input terminal of the CMOS internal inverter 50 in the input protection circuit according to the seventh embodiment. Therefore, the surge voltage that has passed through the third NMOS protective transistor 10 and flowed into the signal line 9 is delayed from reaching the internal inverter 50 by the second resistor 15. This prevents the oxide film from being destroyed.

Figure 8:
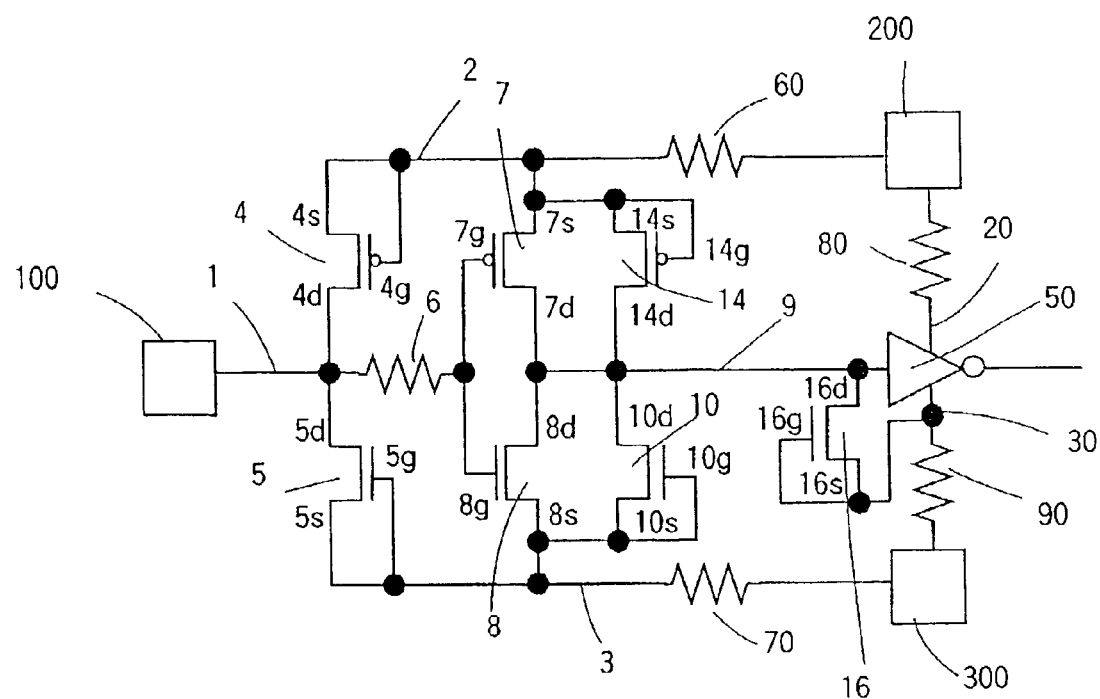
FIG. 8 is a circuit diagram showing an input protection circuit according to the eighth embodiment of the present invention.

FIG. 8 is a circuit diagram showing an input protection circuit according to the eighth embodiment of the present invention. In FIG. 8, the same reference numerals are given to the same components that are already used in FIG. 6. Such components will not be explained again here. The input protection circuit according to the eighth embodiment is obtained by adding a fifth NMOS protective transistor 16 to the input protection circuit according to the sixth embodiment. The drain 16d of the fifth NMOS protective transistor 16 is connected to the signal line 9. The source 16s and gate 16g of the fifth NMOS protective transistor 16 are connected to the neighborhood of the internal inverter 50.

Next, the operation of the input protection circuit of the eighth embodiment will be explained using as an example the case in which an electrostatic surge has entered between the ground terminal 300 and the input terminal 100. When the electrostatic surge flows into the input terminal 100, the electrostatic surge passes through the input line 1, the first NMOS protective transistor 5, and the protective ground potential line 3, in this order, and is absorbed into the ground terminal 300. In this case, the surge voltage that has passed through the third NMOS protective transistor 10 and flowed into the signal line 9 passes through the fifth NMOS protective transistor 16 and the internal circuit ground potential line 30 (and the parasitic resistor 90), and is absorbed into the ground terminal 300.

In the input protection circuit according to the seventh embodiment, the second resistor 15 is formed between the signal line 9 and the input terminal of the CMOS internal inverter 50 so that the surge voltage that has passed through the third NMOS protective transistor 10 and flowed into the signal line 9 will be delayed from reaching the input terminal of the internal inverter 50 by the second resistor 15. However, if the resistance of this second resistor 15 is large, the normal operation is also delayed, slowing down the trans-mission of the input signal. In the input protection circuit according to the eighth embodiment, the fifth NMOS protective transistor 16 is formed so that the surge voltage that is transmitted to the signal line 9 will be absorbed via the internal circuit ground potential line 30. Therefore, the gate oxide film of the transistor that constitutes the internal inverter 50 can be protected without having the second resistor 15 delay the transmission of the input signal.

Figure 9:
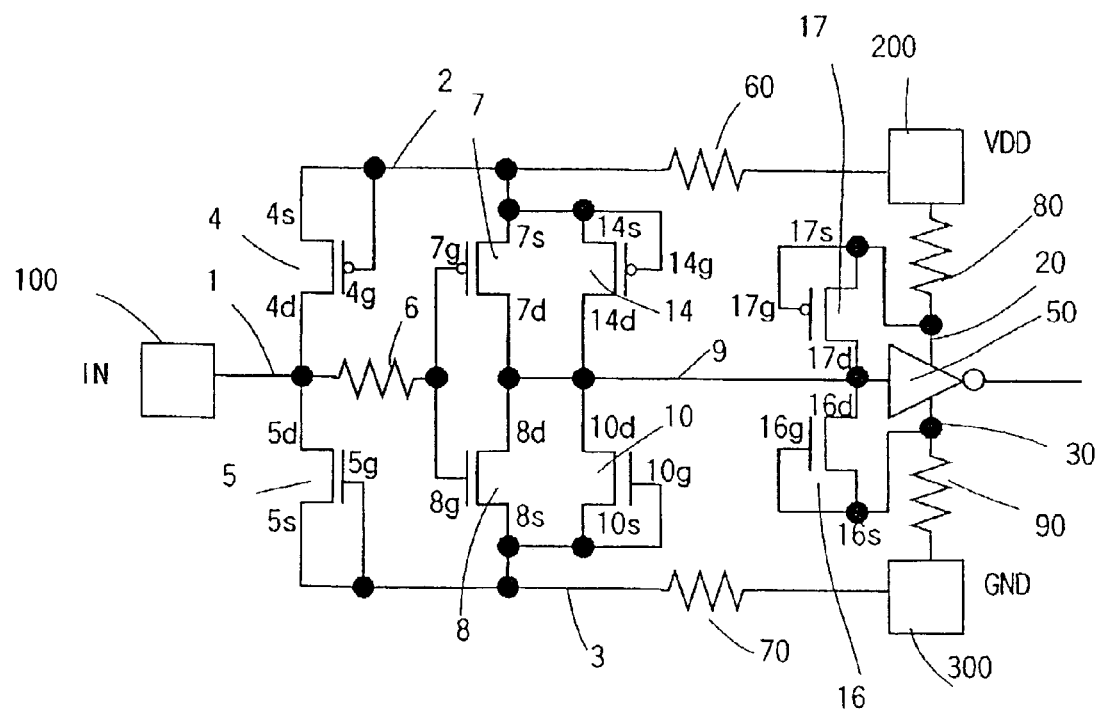
FIG. 9 is a circuit diagram showing an input protection circuit according to the ninth embodiment of the present invention.

FIG. 9 is a circuit diagram showing an input protection circuit according to the ninth embodiment of the present invention. In FIG. 9, the same reference numerals are given to the same components that are already used in FIG. 8. Such components will not be explained again here. The input protection circuit according to the ninth embodiment is obtained by adding a fifth PMOS protective transistor 17 to the input protection circuit according to the eighth embodiment. The drain 17d of the fifth PMOS protective transistor 17 is connected to the signal line 9. The source 17s and gate 17g of the fifth PMOS protective transistor 17 are connected to the neighborhood of the internal circuit power source potential line 20.

Next, the operation of the input protection circuit of the ninth embodiment will be explained using as an example the case in which an electrostatic surge has entered between the power source terminal 200 and the input terminal 100. When the electrostatic surge flows into the input terminal 100, the electrostatic surge passes through the input line 1, the first PMOS protective transistor 4, and the protective power source potential line 2, in this order, and is absorbed into the power source terminal 200. In this case, the surge voltage that has passed through the third PMOS protective transistor 14 and flowed into the signal line 9 passes through the fifth PMOS protective transistor 17 and the internal circuit power source potential line 20 (and the parasitic resistor 80), and is absorbed into the power source terminal 200.

In the input protection circuit according to the ninth embodiment, the fifth PMOS protective transistor 17 is formed so that the sure voltage that has passed through the signal line 9 will be absorbed by the internal circuit power source potential line 20 connected to the internal inverter 50 as well. Therefore, in addition to the protective effect of the input protection circuit of the eight embodiment against the electrostatic surge that flows through between the input terminal 100 and the ground terminal 300, the gate oxide film of the transistor that constitutes the internal inverter 50 can be further protected against the electrostatic surge that flows through between the input terminal 100 and the power source terminal 200. In particular, the input protection circuit of the ninth embodiment is effectively usable for a protection circuit of a device constructed by the SOI process as the input protection circuit of the sixth embodiment.

Figure 10:
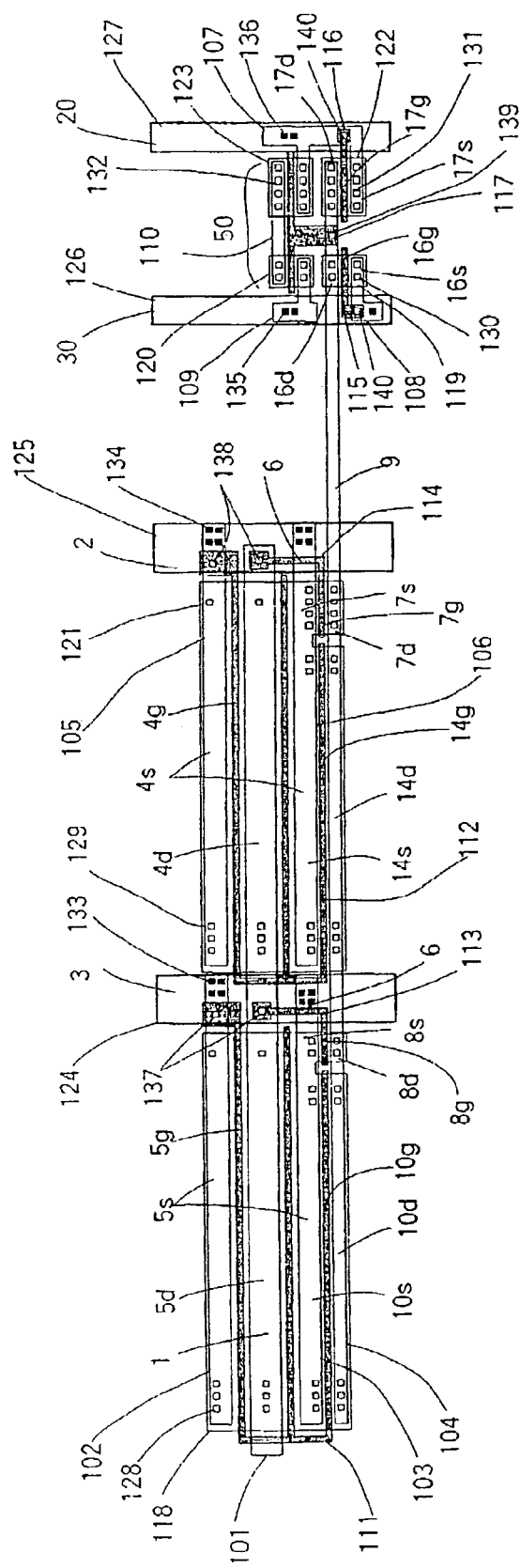
FIG. 10 shows the layout of an input protection circuit according to the tenth embodiment of the present invention.

FIG. 10 shows the layout of an input protection circuit according to the tenth embodiment of the present invention. The input protection circuit according to the tenth embodiment has the same circuit configuration as the input protection circuit according to the ninth embodiment. Therefore, the same reference numerals are used for the portions in which sources, drains, and gates are laid out. Such portions will not be explained again here.

The input protection circuit according to the tenth embodiment has N-type impurity diffusion layers 118 through 120 and P-type impurity diffusion layers 121 through 123 formed on a semiconductor substrate, polysilicide layers 111 through 117 that are used primarily as gate electrodes, first metal layers 101 through 110 that are used as lower layer wiring layers, and second metal layers 124 through 127 that are used as upper layer wiring layers.

Connection holes 128 through 132 are formed between the first metal layers 101 through 110 and the N-type impurity diffusion layers 118 through 120 and P-type impurity diffusion layers 121 through 123. Connection holes 133 through 136 are formed between the second metal layers 124 through 127 and the first metal layers 101 through 110. Connection holes 137 through 140 are formed between the first metal layers 101 through 110 and the poly-silicide layers 111 through 117. The conductive layers 101 through 110 and 124 through 127 are electrically connected to each other via connection holes 128 through 140. The conductive layers 101 through 110 and 124 through 127 are separated from each other by insulating layers not shown in the drawing.

As the layout of FIG. 10 shows, the source 5s of the first NMOS protective transistor 5, and the source 8s of the second NMOS protective transistor 8, and the source 10s of the third NMOS protective transistor 10 are made of the same N-type impurity active region 118. The source 4s of the first PMOS protective transistor 4, the source 7s of the second PMOS protective transistor 7, and the source 14s of the third PMOS protective transistor 14 are made of the same P-type impurity active region 121.

The gate 5g of the first NMOS protective transistor 5 and the gate 10g of the third NMOS protective transistor 10 are made of a common poly-silicide pattern 111 having three linear gate electrodes that are connected together at one end. This common poly-silicide pattern 111 is connected to the first metal layer 105 via the connection hole 137. The poly-silicide pattern 113 that forms the gate 8g of the second NMOS protective transistor 8 is connected to the first metal layer 101 via the connection hole 137. The drain 5d of the first NMOS protective transistor 5 is connected to the first metal layer 101 via connection holes. This first metal layer is connected to the input terminal 100 though not shown in the drawing. A portion (the upper portion in the drawing) of the source 5s of the first NMOS protective transistor 5 is connected to the first metal layer 102 via the connection hole 128. In FIG. 10, the connection holes are not shown throughout the entire widths of the source and drain. However, they are formed in the same manner as in FIGS. 2 and 3. This first metal layer 102 is connected to the second metal layer 124 that constitutes the protective ground potential line 3 via the connection hole 133. The N-type impurity diffusion layer shared by the other portion (lower portion in the drawing) of the source 5s of the first NMOS protective transistor 5, the source 8s of the second NMOS protective transistor 8, and the source 10s of the third NMOS protective transistor 10 are connected to the first metal layer 103 via connection holes. This first metal layer 103 is connected to the second metal layer 124 that constitutes the protective ground potential line 3 via connection holes.

The gate 4g of the first PMOS protective transistor 4 and the gate 14g of the third PMOS protective transistor 14 are made of a common poly-silicide pattern 112 having three linear gate electrodes that are connected together at one end. This common poly-silicide pattern 112 that forms the common gate is connected to the first metal layer 105 via the connection hole 138. The poly-silicide pattern 114 that forms the gate 7g of the second PMOS protection transistor 7 is connected to the first metal layer 101 via connection hole 138. The drain 4d of the first PMOS protection transistor 4 is connected to the first metal layer 101 via connection holes. A portion (the upper portion in the drawing) of the source 4s of the first PMOS protective transistor 4 is connected to the first metal layer 105 via the connection hole 129. This first metal layer 105 is connected to the second metal layer 125 via the connection hole 134. The N-type impurity diffusion layer shared by the other portion (lower portion in the drawing) of the source 4s of the first PMOS protective transistor 4, the source 8s of the second NMOS protective transistor 8, and the source 14s of the third PMOS protective transistor 14 are connected to the first metal layer 106 via connection holes. This first metal layer 106 is connected to the second metal layer 125 that constitutes the protective power source potential line 2 via connection holes. The drain 8d of the second NMOS protective transistor 8, the drain 10d of the third NMOS protective transistor 10, the drain 7d of the second PMOS protective transistor 7, and the drain 14d of the third PMOS protective transistor 14 are connected to the first metal layer 104 that constitutes the signal line 9. This first metal layer 104 is connected to the drain 16d of the fifth NMOS protective transistor 16 and the drain 17d of the fifth PMOS protective transistor 17 as well. The poly-silicide pattern 115 that forms the gate 16g of the fifth NMOS protective transistor 16 is connected to the first metal layer 108 via connection hole 140. This first metal layer 108 is connected to the source 16s of the fifth NMOS protective transistor 16 via the connection hole 130 and the second metal layer 126 that forms the internal circuit ground potential line 30 via connection holes. The poly-silicide pattern 116 that forms the gate 17g of the fifth PMOS protective transistor 17 is connected to the first metal layer 107 via connection hole 140. This first metal layer 107 is connected to the source 17s of the fifth PMOS protective transistor 17 and the source of the PMOS transistor of the internal inverter 50 via the connection hole 131, and is also connected to the second metal layer 127 that forms the internal circuit power source potential line 20 via the connection hole 136. The gates of the PMOS transistor and NMOS transistor that constitute the internal inverter 50 are made of the poly-silicide pattern 117 as input lines of the internal inverter 50, and are connected to the first metal layer 104 via the connection hole 139. The drains of the PMOS transistor and NMOS transistor that constitute the internal inverter 50 are connected to the first metal layer 110 via connection holes. This first metal layer 110 is connected to another internal circuit not shown in the drawing. The sources of the PMOS transistor and NMOS transistor that constitute the internal inverter 50 are connected to the first metal layer 109 via connection holes. This first metal layer 109 is connected to the second metal layer 126 that constitutes the internal circuit ground potential line 30 via the connection hole 135.

As is evident from FIG. 10, the dimensions of the first NMOS protective transistor 5 are the largest of all the NMOS protective transistors. The dimensions of the third NMOS protective transistor 10 are about half as large as the dimensions of the first NMOS protective transistor 5. The dimensions of the second NMOS protective transistor 8 are significantly smaller than those of the first NMOS protective transistor 5 and third NMOS protective transistor 10. Moreover, the dimensions of the first PMOS protective transistor 4 are the largest of all the PMOS protective transistors. The dimensions of the third PMOS protective transistor 14 are about half as large as the dimensions of the first PMOS protective transistor 4. The dimensions of the second PMOS protective transistor 7 are significantly smaller than those of the first PMOS protective transistor 4 and third PMOS protective transistor 14. The first protective transistors 4 and 5 are made much larger than the second protective transistors 7 and 8 because the first protective transistors 4 and 5 are directly exposed to the surge current or the like and the second protective transistors 7 and 8 do not directly pass the surge current.

Thus, according to the input protective circuit of the tenth embodiment, the source 5s of the first NMOS protective transistor 5, the source 8s of the second NMOS protective transistor 8, and the source 10s of the third NMOS protective transistor 10 are made of the same N-type impurity active region 118. Therefore, the drains of these NMOS protective transistors have the same electric potential. Moreover, the source 4s of the first PMOS protective transistor 4, the source 7s of the second PMOS protective transistor 7, and the source 14s of the third PMOS protective transistor 14 are made of the same P-type impurity active region 121. Therefore, the drains of these PMOS protective transistors have the same electric potential.

Based on these assumptions, the operation of the input protection,circuit of the tenth embodiment will be explained using as an example the case in which an electrostatic surge has entered between the input terminal 100 and the power source terminal 200. In order to protect the gate oxide film on the source 8s side of the second NMOS protective transistor 8 from the electrostatic surge that has entered into the input terminal 100, the voltage that has been transmitted to the source 5s of the first NMOS protective transistor 5 via the first NMOS protective transistor 5 must be transmitted to the source 8s of the second NMOS protective transistor 8 as quickly as possible.

Moreover, in order to protect the gate oxide film on the drain side 8d of the second NMOS protective transistor 8, the voltage transmitted to the source 5s of the first NMOS protective transistor 5 must be quickly transmitted to the source 10s of the third NMOS protective transistor 10 to have the third NMOS protective transistor 10 transmit the surge voltage to the signal line 9 as quickly as possible to maximize the protection performance of the input protection circuit. In the input protection circuit of the tenth embodiment, the source 5s of the first NMOS protective transistor 5 and the second source 8s of the second NMOS protective transistor 8 are formed together in the same impurity active region. The source 5s of the first NMOS protective transistor 5 and the third source 10s of the third NMOS protective transistor 10 are also formed together in the same impurity active region. Therefore, in comparison with the case in which these sources 5s, 8s, and 10s are formed separately and connected with a metal wire, the surge voltage is transmitted faster. As a result, the gate oxide films can be more effectively protected. The same effect can be achieved for the first, second, and third PMOS protective transistors 4, 7, and 14, respectively. In the input protection circuit of the tenth embodiment, the sources of multiple transistors are formed together in the same impurity active region. Hence, the pattern area occupied by the circuit can be reduced, which is an advantage.

Figure 11:
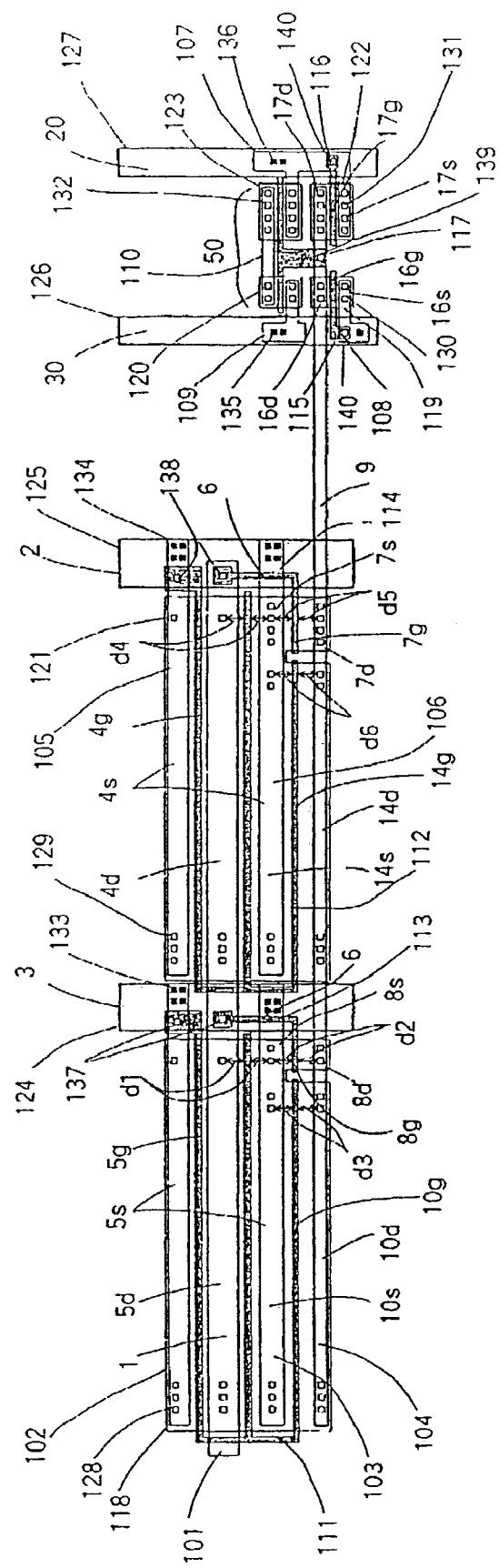
FIG. 11 shows the layout of an input protection circuit according to the eleventh embodiment of the present invention.

FIG. 11 shows the layout of an input protection circuit according to the eleventh embodiment of the present invention. A large part of the input protection circuit according to the eleventh embodiment has the same circuit configuration as the input protection circuit according to the tenth embodiment. Therefore, the same reference numerals are used for the same components used in FIG. 10. Such components will not be explained again here. The input protection circuit of the eleventh embodiment differs (or is improved) from that of the tenth embodiment in that the distances between the connection holes and the gate electrodes are specified. Specifically, the distance d1 from the connection holes that connect the source 5s and drain 5d of the first NMOS protective transistor 5 and the first metal layer, respectively, to the gate electrode 5g of the first NMOS protective transistor 5 and the distance d2 from the connection holes that connect the source 8s and drain 8d of the second NMOS protective transistor 8 and the first metal layer, respectively, to the gate electrode 8g of the second NMOS protective transistor 8 are specified to satisfy the relation $d1 \leq d2$. Moreover, the distance d3 from the connection holes that connect the source 10s and drain 10d of the third NMOS protective transistor 10 and the first metal layer, respectively, to the gate electrode 10g of the third NMOS protective transistor 10 is specified to satisfy the relation $d1 \leq d3$.

Similar relations are specified for the PMOS protective transistors. Specifically, the distance d4 from the connection holes that connect the source 4s and drain 4d of the first PMOS protective transistor 4 and the first metal layer, respectively, to the gate electrode 4g of the first PMOS protective transistor 4 and the distance d5 from the connection holes that connect the source 7s and drain 7d of the second PMOS protective transistor 7 and the first metal layer, respectively, to the gate electrode 7g of the second PMOS protective transistor 7 are specified to satisfy the relation $d4 \leq d5$. Moreover, the distance d6 from the connection holes that connect the source 14s and drain 14d of the third PMOS protective transistor 14 and the first metal layer, respectively, to the gate electrode 14g of the third PMOS protective transistor 14 is specified to satisfy the relation $d4 \leq d6$.

The operation of the input protection circuit of the eleventh embodiment will be explained using as an example the case in which an electrostatic surge has entered between the ground terminal 300 and the power source terminal 200. When an electrostatic surge flows into the power source terminal 200, the electrostatic surge can reach the ground terminal 300 through the following two paths. The first path passes through the source 4s and drain 4d of the first PMOS protective transistor 4 (that is, the input line 1), the drain 5d and source 5s of the first NMOS protective transistor 5, in this order, and reaches the ground terminal 300. The second path passes through the source 7s of the second PMOS protective transistor 7, the drain 7d (signal line 9) of the second PMOS protective transistor 7, the drain 8d of the second NMOS protective transistor 8, and the source 8s of the second NMOS protective transistor 8, in this order, and reaches the ground terminal 300 or the source 14s of the third PMOS protective transistor 14, the drain 14d (signal line 9) of the third PMOS protective transistor 14, the drain 10d of the third NMOS protective transistor 10, and the source 10s of the third NMOS protective transistor 10, and reaches the ground terminal 300.

As has been explained in the tenth embodiment, the dimensions (areas) of the second NMOS protective transistor 8 and second PMOS protective transistor 7 are smaller than those of the first NMOS protective transistor 5 and first PMOS protective transistor 4, respectively. Therefore, the distances from the gate electrodes of the second NMOS protective transistor 8 and second PMOS protective transistor 7 to the connection holes of the source, drain, and first metal layer of the second NMOS protective transistor 8 and second PMOS protective transistor 7, respectively, can be made smaller than corresponding those of the first NMOS protective transistor 5 and first PMOS protective transistor 4. When the distances from the gate electrodes to the connection holes are decreased, the parasitic resistance of the source and the parasitic resistance of the drain are also decreased. When the distance from the gate electrodes of the second PMOS protective transistor 7 and second NMOS protective transistor 8 to the connection holes of the source, drain, and the first metal layer is decreased, the proportion of the surge current that flows through the second path from the power source terminal 200 to the ground terminal 300 increases.

In the input protection circuit of the eleventh embodiment, the distances d1, d2, d3, d4, d5, and d6 from the connection holes to the first metal layers are specified to satisfy the relation d1 23 d2, d1≦d3, d4≦d5, and d4≦d6. However, as is clear from the explanation above, it is desirable that these distances actually satisfy strict inequalities d1≦d2, d1≦d3, d4≦d5, and d4≦d6.

Thus, the input protection circuit of the eighth embodiment is designed to cause the surge current to flow through the path that contains the first PMOS protective transistor 4 and the first NMOS protective transistor 5 which require large areas. Therefore, the increase in the circuit area is suppressed, and a high degree of electrostatic breaking resistance against an electrostatic surge that flows between the power source terminal 200 and the ground terminal 300 can be achieved.

The input protection circuits of the first through eighth embodiments are CMOS type input protection circuits. However, the present invention is applicable not only to an open drain type input protection circuit that has either an NMOS transistor or PMOS transistor as a protective transistor but also to an input terminal whose signal line is connected to the gate of a single MOS transistor.

Thus, according to the present invention, an additional protective transistor (second protective transistor) connected to the protective power source supply line (protective power source potential line or protective ground potential line) connected to the protective transistor that bypasses the surge voltage (first protective transistor) is formed such that the drain of the second protective transistor is connected to the internal circuit signal line and the gate electrode of the second protective transistor is connected to the input line. Therefore, the gate oxide film of this second protective transistor can be effectively protected from the surge current.

What is claimed is:

1. An input protection circuit comprising:
    an input terminal which receives an input signal;
    a first power source terminal which receives a first power source electric potential;
    a second power source terminal which receives a second power source electric potential;
    a first power source line connected to said first power source terminal;
    a second power source line connected to said second power source terminal;
    a first input protective transistor of a first conductive type having a drain, a gate and a source, said drain being connected to said input terminal, and said gate and said source being connected to said first power source line;
    a second input protective transistor of a second conductive type having a drain, a gate and a source, said drain being connected to said input terminal, and said gate and said source being connected to said second power source line; and
    an inverter including a first transistor and a second transistor, said first transistor having a drain, a gate and a source, said drain being connected to an internal circuit, said gate being connected to the input terminal via a protective resistor, and said source being connected to said first power source line, and said second transistor having a drain, a gate and a source, said drain being connected to the internal circuit, said gate being connected to the input terminal via the protective resistor, and said source being connected to said second power source line,
    wherein the source of the first input protective transistor and the source of the first transistor of the inverter are formed in a common region in a first conductive type impurity active region.

2. An input protection circuit as claimed in claim 1, wherein said protective resistor includes a polycide pattern.

3. An input protection circuit as claimed in claim 1, wherein said protective resistor includes a diffusion resistor.

4. An input protection circuit as claimed in claim 1, wherein said first conductivity type is a p-type, and said second conductivity type is an n-type.

5. An input protection circuit as claimed in claim 4, wherein said first power source line supplies a power supply voltage and said second power source line supplies a ground potential.

6. An input protection circuit as claimed in claim 1, wherein said first power source line supplies a power supply voltage and said second power source line supplies a ground potential.

7. An input protection circuit comprising:
    an input terminal which receives an input signal;
    a first transistor of a first conductive type which has a source, a drain and a gate, wherein said drain is coupled to the input terminal; and
    a second transistor of said first conductive type which has a source, a drain and a gate, wherein said gate is coupled to the input terminal, and said drain is coupled to an internal circuit;
    wherein the source of the first transistor of said first conductive type and the source of the second transistor of said first conductive type are formed in a common impurity active region, for quickly setting the gate of the second transistor and the source of the second transistor to the same electric potential after a surge voltage is applied to the input terminal.

8. An input protection circuit as claimed in claim 7, further comprising a protective resistor connected between the gate of the second transistor and the drain of the first transistor.

9. An input protection circuit as claimed in claim 8, wherein said protective resistor includes a polycide pattern.

10. An input protection circuit as claimed in claim 8, wherein said protective resistor includes a diffusion resistor.

11. An input protection circuit as claimed in claim 7, wherein said first conductive type is a p-type.

12. An input protection circuit comprising:
    an input terminal which receives an input signal;
    a first transistor of a first conductive type which has a source, a drain and a gate, said source and said gate being electrically connected to each other, wherein said drain is coupled to the input terminal; and
    a second transistor of said first conductive type which has a source, a drain and a gate, wherein said gate is coupled to the input terminal, and said drain is coupled to an internal circuit, and wherein the source of the first transistor of said first conductive type and the source of the second transistor of said first conductive type are formed in a common impurity active region.

13. An input protection circuit as claimed in claim 12, further comprising a protective resistor connected between the gate of the second transistor and the drain of the first transistor.

14. An input protection circuit as claimed in claim 13, wherein said protective resistor includes a polycide pattern.

15. An input protection circuit as claimed in claim 13, wherein said protective resistor includes a diffusion resistor.

16. An input protection circuit as claimed in claim 12, wherein said first conductive type is a p-type.

17. An input protection circuit comprising:
an input terminal which receives an input signal;
a first transistor of a first conductive type which has a source, a drain and a gate, wherein said drain is coupled to the input terminal; and
a second transistor of said first conductive type which has a source, a drain and a gate, wherein said gate is coupled to the input terminal, and said drain is coupled to an internal circuit, and wherein the source of the first transistor of said first conductive type and the source of the second transistor of said first conductive type are formed in a common impurity active region.

18. An input protection circuit as claimed in claim 17, further comprising a protective resistor connected between the gate of the second transistor and the drain of the first transistor.

19. An input protection circuit as claimed in claim 18, wherein said protective resistor includes a polycide pattern.

20. An input protection circuit as claimed in claim 18, wherein said protective resistor includes a diffusion resistor.

21. An input protection circuit as claimed in claim 17, wherein said first conductive type is a p-type.

* * * * *